US012787676B2

(12) United States Patent
Hsu et al.

(10) Patent No.: US 12,787,676 B2
(45) Date of Patent: Nov. 3, 2026

(54) MANUFACTURING METHOD OF OVERLAY MARK

(71) Applicant: Winbond Electronics Corp., Taichung City (TW)

(72) Inventors: Chiao-Ling Hsu, Kaohsiung (TW); Isao Tanaka, Kaohsiung (TW)

(73) Assignee: Winbond Electronics Corp., Taichung City (TW)

(*) Notice: Subject to any disclaimer, the term of this patent is extended or adjusted under 35 U.S.C. 154(b) by 362 days.

(21) Appl. No.: 18/674,936

(22) Filed: May 27, 2024

(65) Prior Publication Data

US 2025/0308925 A1 Oct. 2, 2025

(30) Foreign Application Priority Data

Mar. 29, 2024 (TW) .................................. 113111969

(51) Int. Cl.
*H10P 50/00* (2026.01)
*H10W 46/00* (2026.01)

(52) U.S. Cl.
CPC .............. *H10P 50/73* (2026.01); *H10P 50/71* (2026.01); *H10W 46/00* (2026.01); *H10W 46/301* (2026.01)

(58) Field of Classification Search
None
See application file for complete search history.

(56) References Cited

U.S. PATENT DOCUMENTS

2013/0216776 A1* 8/2013 Arnold .................. G03F 7/0035 430/323
2017/0125300 A1* 5/2017 Kim ................... H10D 84/0135
2022/0392768 A1* 12/2022 Wang .................... G03F 7/2022

* cited by examiner

*Primary Examiner* — Julio J Maldonado
*Assistant Examiner* — Pinaki Das
(74) *Attorney, Agent, or Firm* — JCIPRNET

(57) ABSTRACT

A manufacturing method of an overlay mark including the following steps is provided. A first mask ring is formed on a target layer. A first dielectric layer is formed on the first mask ring. A second mask ring is formed on the first dielectric layer. The second mask ring, the first dielectric layer and the first mask ring are patterned to form a third mask ring on the target layer corresponding to the overlapping region of the first and the second mask rings. A second dielectric layer is formed on the target layer and the third mask ring. A mask pattern layer having an opening is formed on the second dielectric layer. The inner sidewall of the opening is aligned with that of the third mask ring. A part of the second dielectric layer and the target layer are removed using the mask pattern layer as a mask.

19 Claims, 16 Drawing Sheets

MANUFACTURING METHOD OF OVERLAY MARK

CROSS-REFERENCE TO RELATED APPLICATION

This application claims the priority benefit of Taiwan application serial no. 113111969, filed on Mar. 29, 2024. The entirety of the above-mentioned patent application is hereby incorporated by reference herein and made a part of this specification.

BACKGROUND

Technical Field

The present invention relates to a manufacturing method of a mark used in a semiconductor process, and in particular, to a manufacturing method of an overlay mark.

Description of Related Art

In the semiconductor process, the overlay mark is used to check the alignment between the previous layer and the current layer. Generally speaking, the overlay mark may be formed in the peripheral region of the substrate, such as the scribe line, and the formation steps of the overlay mark are usually integrated with the formation steps of the devices in the device region.

For example, when the pad array is formed on the substrate in the device region, an overlay mark with the same pattern may be formed on the substrate in the peripheral region. However, when measuring alignment with the optical instrument, such type of overlay mark often cannot have a clear optical image, and the contrast of the optical image is low, thus causing alignment measurement errors.

SUMMARY

The present invention provides a manufacturing method of an overlay mark, which may form an overlay mark with a high optical image contrast.

The manufacturing method of the overlay mark of the present invention includes the following steps. A target layer is formed on a substrate. A first mask ring is formed on the target layer. A first dielectric layer is formed on the first mask ring. A second mask ring is formed on the first dielectric layer, wherein a length of the first mask ring in a first direction is greater than a length of the second mask ring in the first direction, a length of the first mask ring in a second direction is less than a length of the second mask ring in the second direction, and the first direction is interlaced with the second direction. A patterning process is performed on the second mask ring, the first dielectric layer and the first mask ring to form a third mask ring on the target layer corresponding to an overlapping region of the first mask ring and the second mask ring. A second dielectric layer is formed on the target layer and the third mask ring. A mask pattern layer is formed on the second dielectric layer, wherein the mask pattern layer has an opening, and the inner sidewall of the opening is aligned with the inner sidewall of the third mask ring. A part of the second dielectric layer and a part of the target layer are removed using the mask pattern layer as a mask. The mask pattern layer, the second dielectric layer and the third mask ring are removed.

Based on the above, a bulk overlay mark is formed on the substrate by forming two mask rings partially overlapped and through a mask ring defined by the overlapped portion and a mask pattern layer located thereon. In this way, the formed overlay mark may have a high optical image contrast, and the formation steps of the overlay mark may be integrated with the formation steps of the semiconductor devices in the device region.

DESCRIPTION OF THE EMBODIMENTS

Figure 1A:
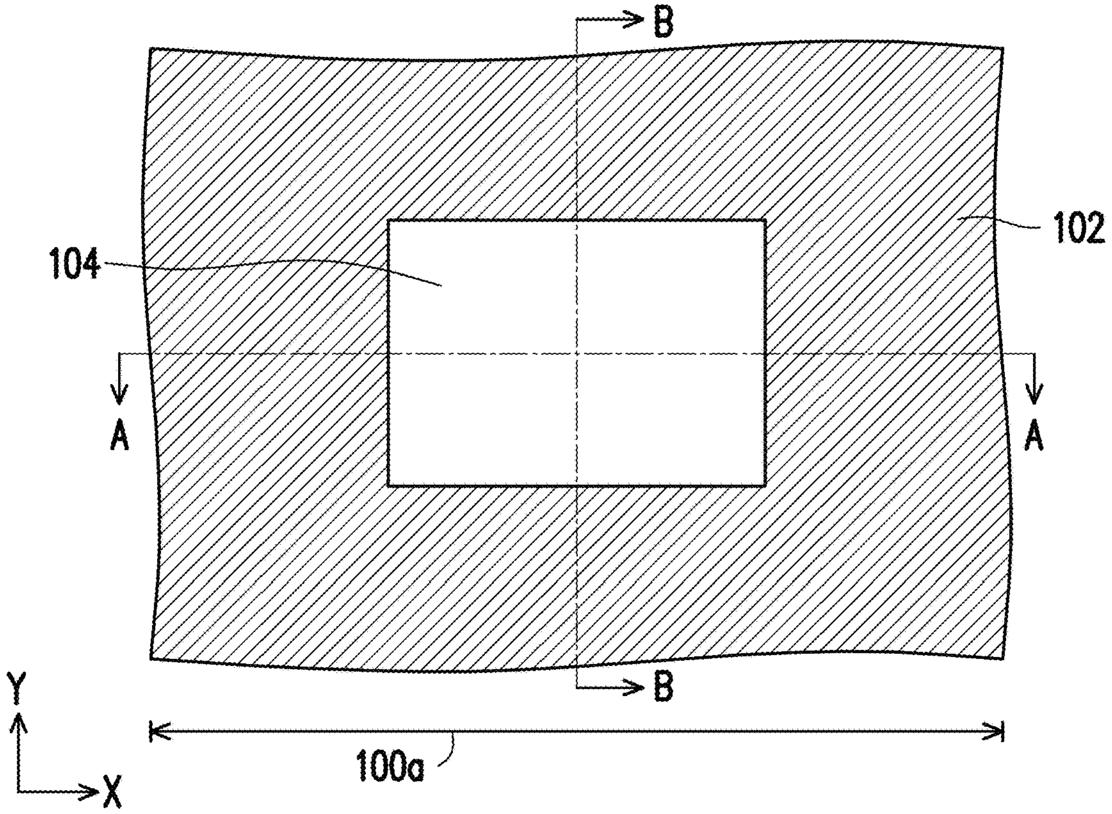
FIGS. 1A to 1H are schematic top views of the manufacturing process of the overlay mark of the embodiment of the present invention.
Figure 1A:
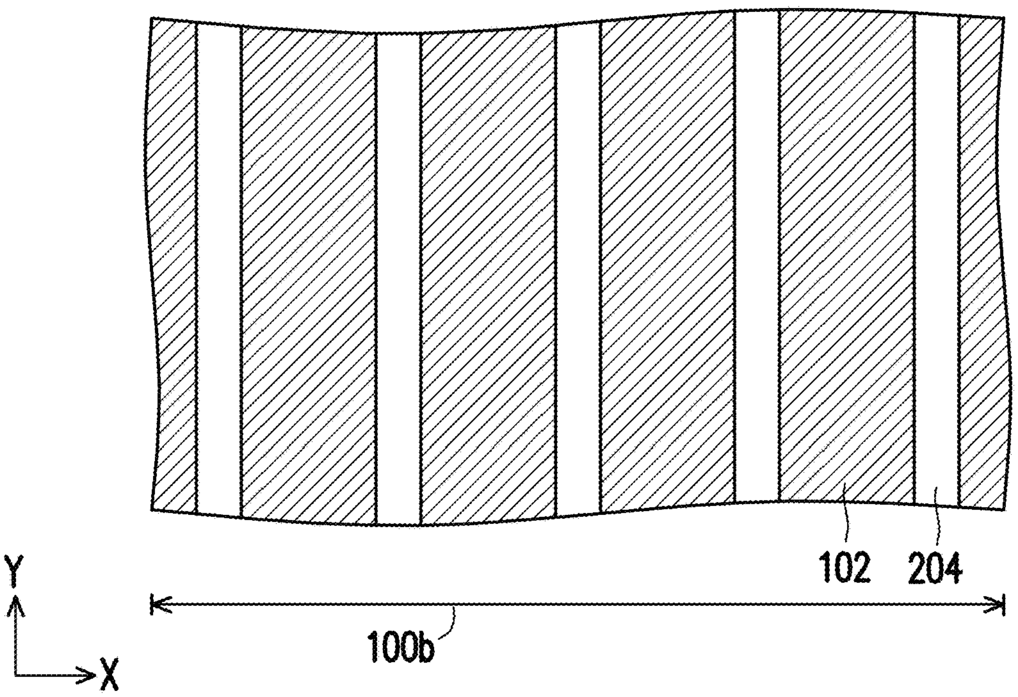
Figure 2A:
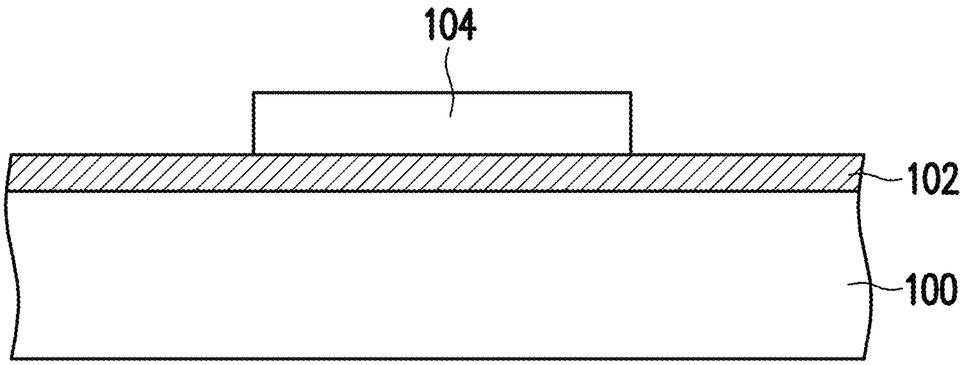
FIGS. 2A to 2H are schematic cross-sectional views of the manufacturing process along the line A-A in FIGS. 1A to 1H.
Figure 3A:
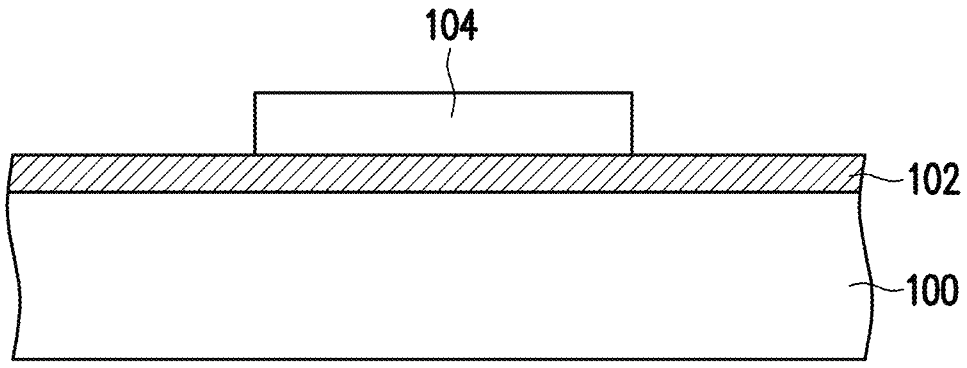
FIGS. 3A to 3H are schematic cross-sectional views of the manufacturing process along the line B-B in FIGS. 1A to 1H.

Referring to FIGS. 1A, 2A and 3A, a substrate 100 is provided. In the present embodiment, the substrate 100 has a peripheral region 100*a* and a device region 100*b*. The substrate 100 includes a silicon base and a dielectric layer formed on the silicon base. In the device region 100*b*, the semiconductor devices, such as the transistor, the interconnect structure, the circuit pattern, etc., may be formed on the silicon substrate, and the dielectric layer covers these semiconductor devices. The peripheral region 100*a* may be a region in which the overlay mark is disposed. The device region 100*b* may be a part of the entire device region or the entire device region.

A conductive layer 102 is formed on the substrate 100. The conductive layer 102 may be a metal layer, such as a tungsten layer, but the present invention is not limited thereto. In detail, in the peripheral region 100*a*, the conductive layer 102 may be a target layer used to form the overlay mark, and in the device region 100*b*, the conductive layer 102 may be a device material layer used to form the semiconductor devices. For example, the conductive layer 102 in the device region 100*b* may be used to form a pad array, so the conductive layer 102 may be regarded as a pad material layer. In the present embodiment, the target layer in peripheral region 100*a* corresponds to the device material layer in device region 100*b*.

With the advancement of semiconductor processes, the size of semiconductor device continues to shrink. Therefore, various self-align multi-patterning processes may be used to form the semiconductor device. In the present invention, a self-aligned double patterning (SADP) process is used to form the device in the device region 100*b*. In other embodiments, a self-align triple patterning (SATP) process or a self-aligned quadruple patterning (SAQP) process may also be used.

After the conductive layer 102 is formed, a first bulk pattern layer 104 is formed on the conductive layer 102 in the peripheral region 100*a*, and a plurality of first strip pattern layers 204 extending along the Y direction and parallel to each other are formed on the conductive layer 102 in the device region 100*b*. In the present embodiment, the first bulk pattern layer 104 and the first strip pattern layers 204 are defined simultaneously through one photomask. That is, no additional photomask is required to form the first bulk pattern layer 104 in the peripheral region 100*a*, and no additional process steps are required.

Figure 1B:
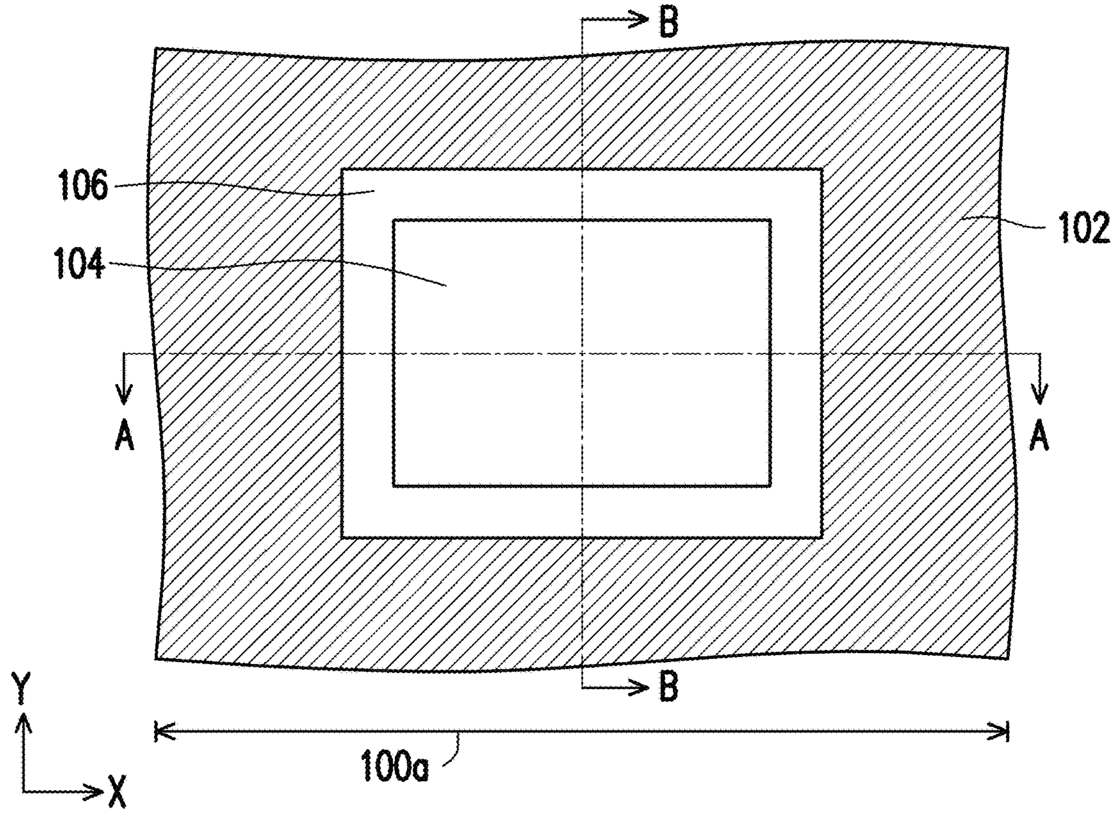
Figure 1B:
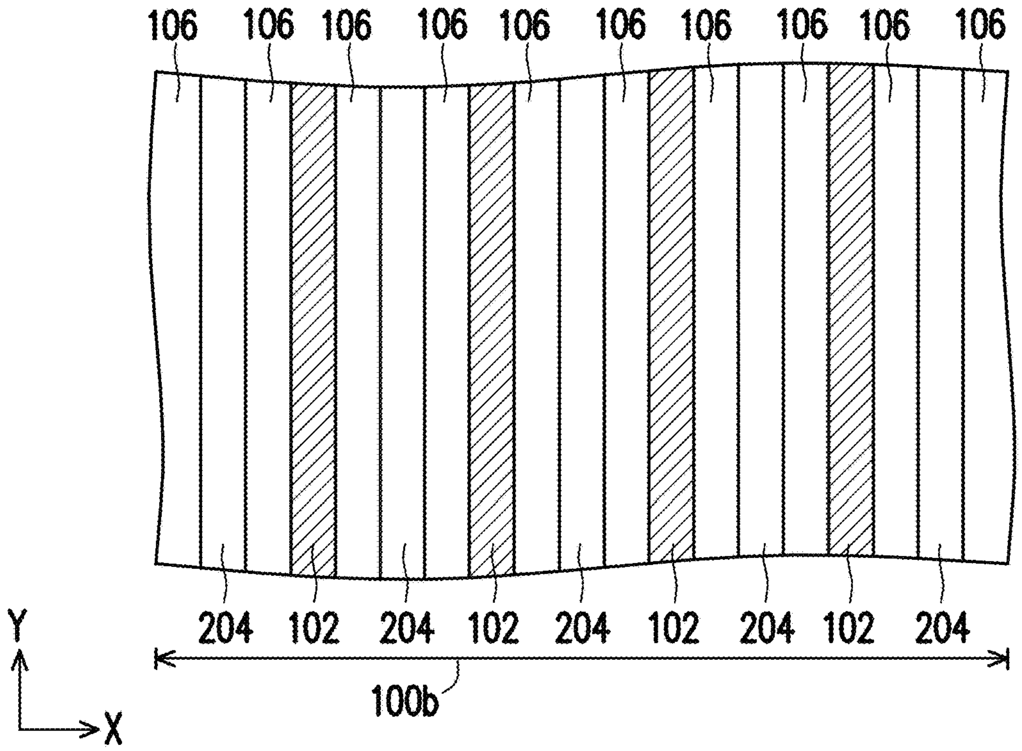
Figure 2B:
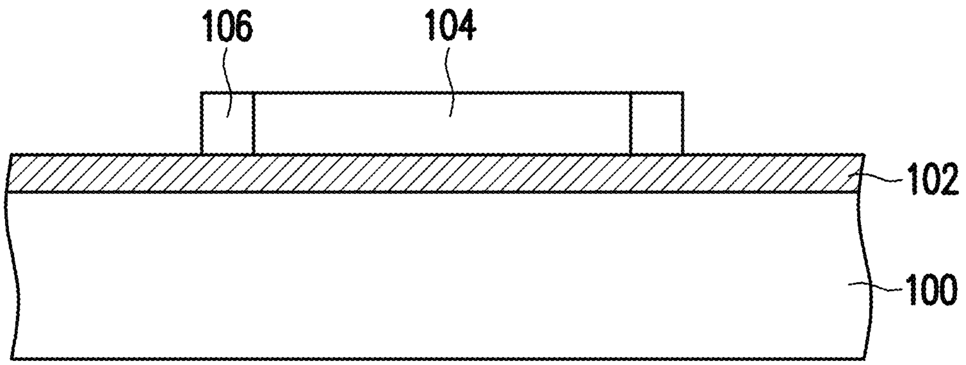
Figure 3B:
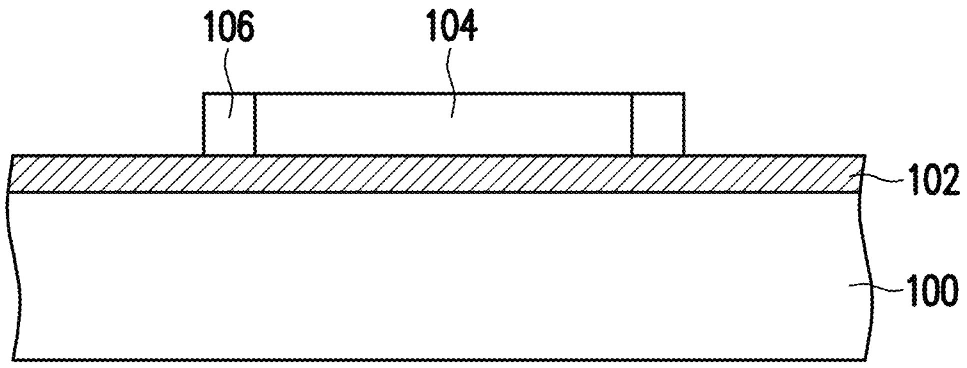

Referring to FIGS. 1B, 2B and 3B, a first mask material layer 106 is formed on the substrate 100. In the peripheral region 100*a*, the first mask material layer 106 is formed on the sidewall of the first bulk pattern layer 104 to surround the first bulk pattern layer 104. In addition, in the device region 100*b*, the first mask material layer 106 is formed on the sidewalls of the first strip pattern layers 204 to surround the first strip pattern layers 204.

A method for forming the first mask material layer 106 may include the following steps. First, a layer of mask material is conformally formed on the substrate 100. Then, an anisotropic etching process is performed to remove a part of the mask material. After the anisotropic etching process is performed, in the device region 100*b*, the first mask material layer 106 located at the ends of the first strip pattern layer 204 may be further removed. As a result, strip-shaped first mask material layers 106 extending along the Y direction and parallel to each other are formed at both sides of the first strip pattern layer 204.

Figure 1C:
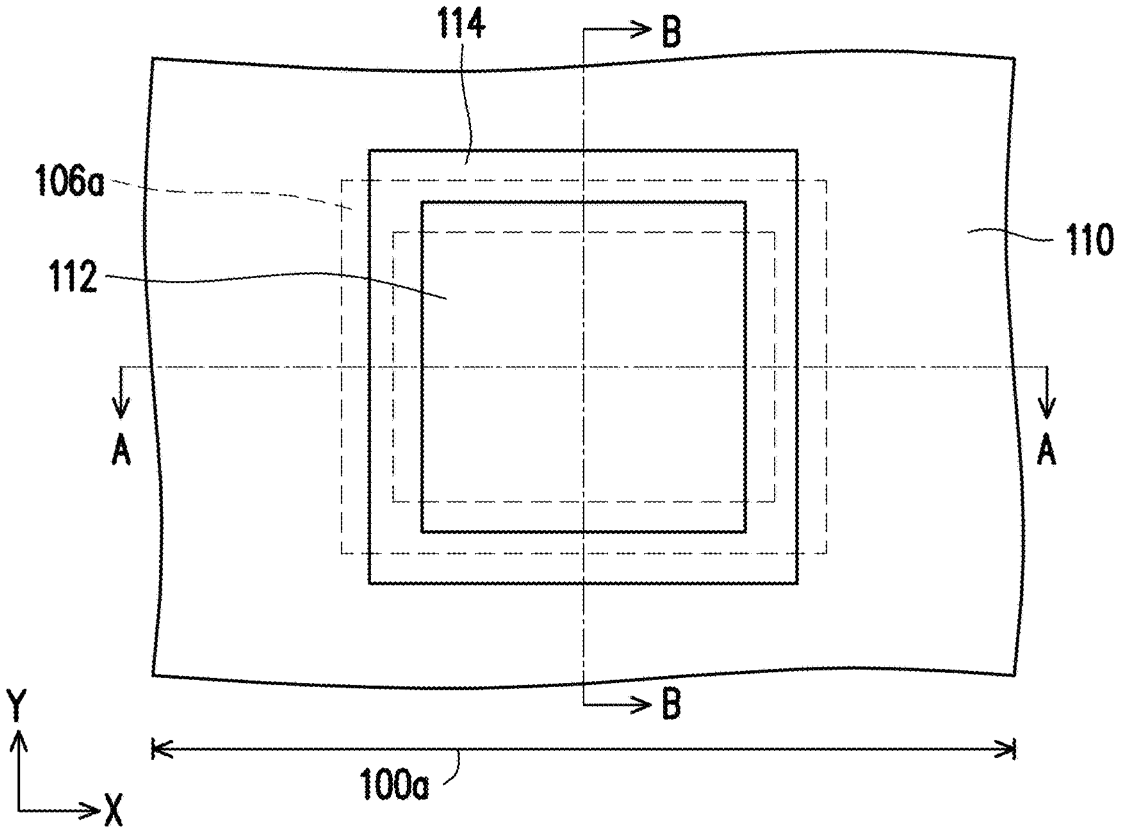
Figure 1C:
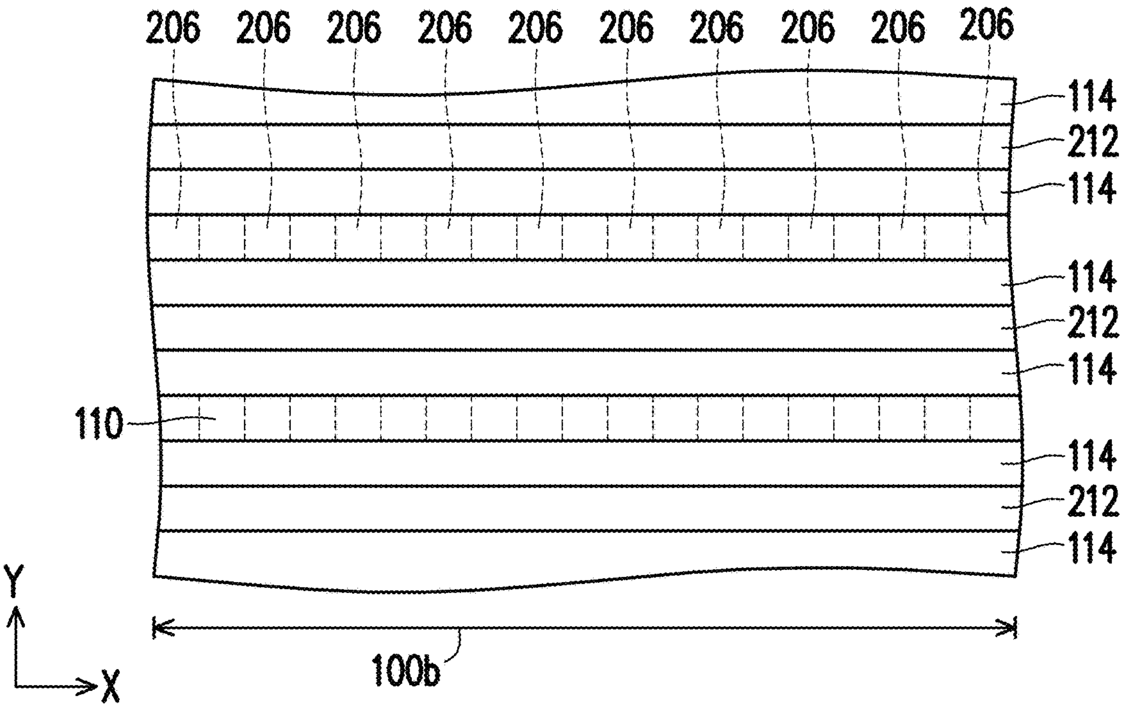
Figure 2C:
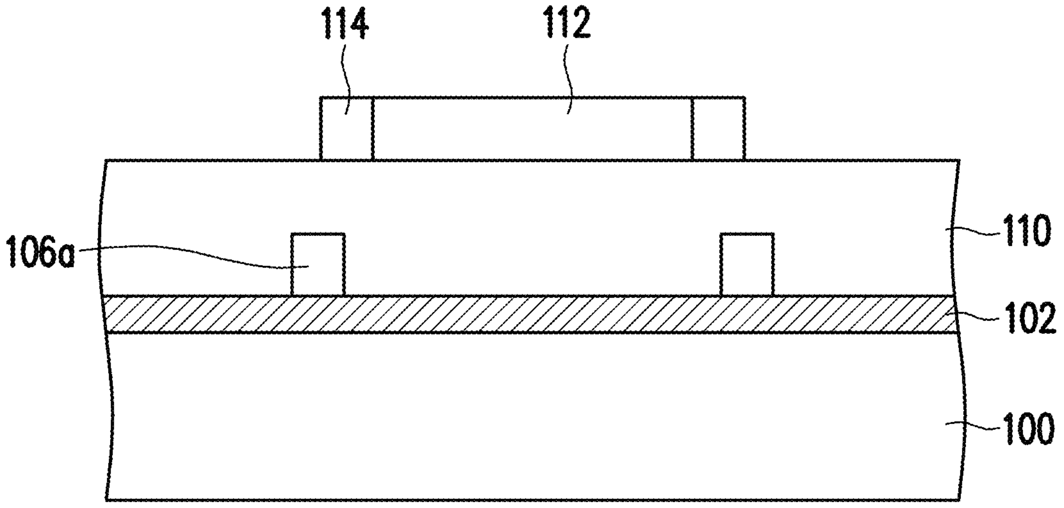
Figure 3C:
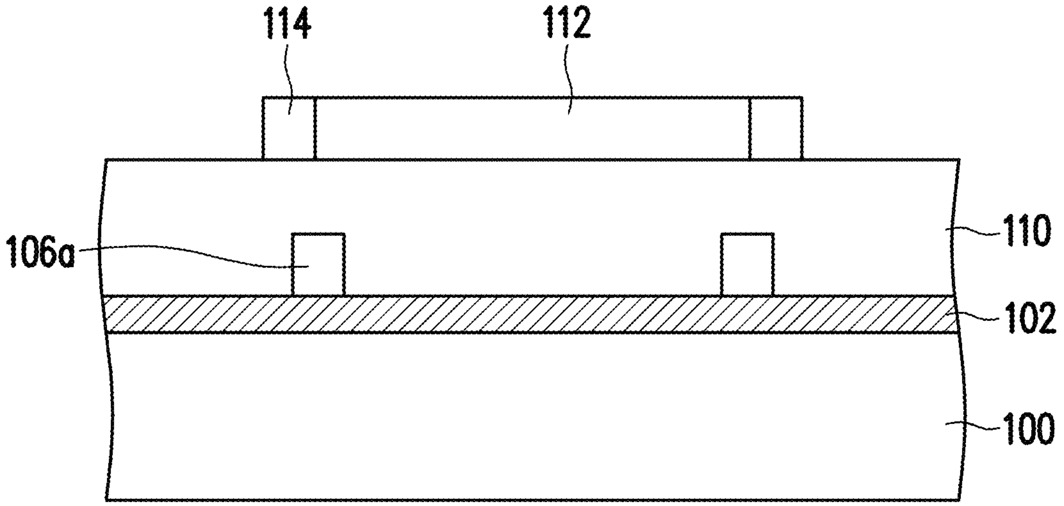

Referring to FIGS. 1C, 2C and 3C, the first bulk pattern layer 104 and the first strip pattern layers 204 are removed. A first mask ring 106*a* (the first mask material layer 106) is remained on the conductive layer 102 in the peripheral region 100*a*, and a plurality of first mask strips 206 (the first mask material layer 106) are remained on the conductive layer 102 in the device region 100*b*. In the present embodiment, a well-known self-aligned double patterning process may be used to form the first mask ring 106*a* and the first mask strips 206.

A first dielectric layer 110 is formed on the substrate 100. The first dielectric layer 110 covers the conductive layer 102, the first mask ring 106*a* and the first mask strips 206. After that, a second bulk pattern layer 112 is formed on the first dielectric layer 110 in the peripheral region 100*a*, and a plurality of second strip pattern layers 212 extending along the X direction and parallel to each other are formed on the first dielectric layer 110 in the device region 100*b*. The second bulk pattern layer 112 and the second strip pattern layers 212 are defined simultaneously through one photomask. That is, no additional photomask is required to form the second bulk pattern layer 112 in the peripheral region 100*a*, and no additional process steps are required.

The second bulk pattern layer 112 is located above the first bulk pattern layer 104 shown in FIGS. 1B, 2B and 3B. The length of the second bulk pattern layer 112 in the X direction is less than the length of the first bulk pattern layer 104 in the X direction, and the length of the bulk pattern layer 112 in the Y direction is greater than the length of the first bulk pattern layer 104 in the Y direction. The position of the first bulk pattern layer 104 and the position of the second bulk pattern layer 112 are partially overlapped.

A second mask material layer 114 is formed on the substrate 100. In the peripheral region 100*a*, the second mask material layer 114 is formed on the sidewall of the second bulk pattern layer 112 to surround the second bulk pattern layer 112. In the device region 100*b*, the second mask material layer 114 is formed on the sidewalls of the second strip pattern layers 212 to surround the second strip pattern layers 212. A method for forming the second mask material layer 114 is the same as that of the first mask material layer 106. As a result, strip-shaped second mask material layers 114 extending along the Y direction and parallel to each other are formed at both sides of the second strip pattern layer 212.

Figure 1D:
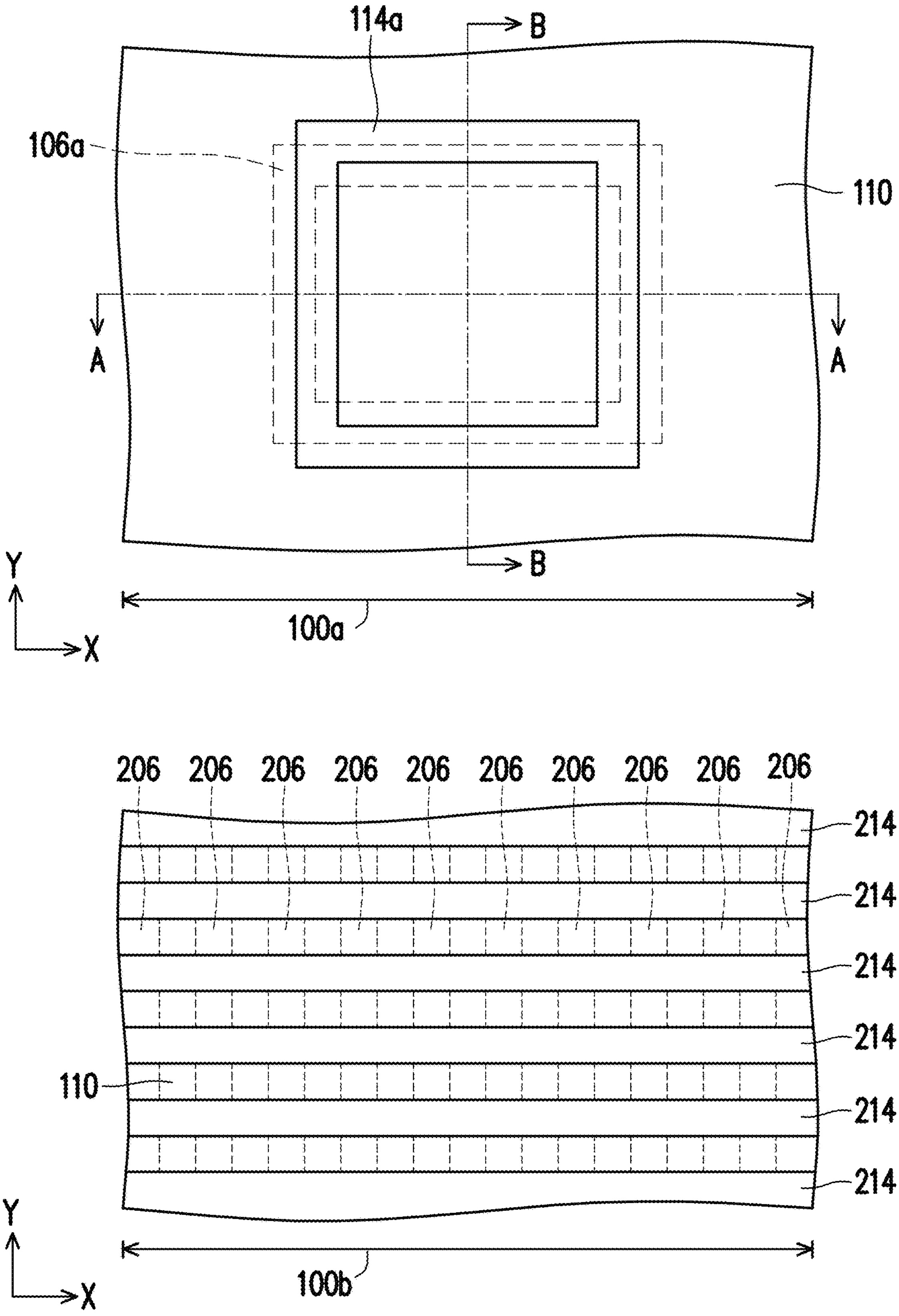
Figure 2D:
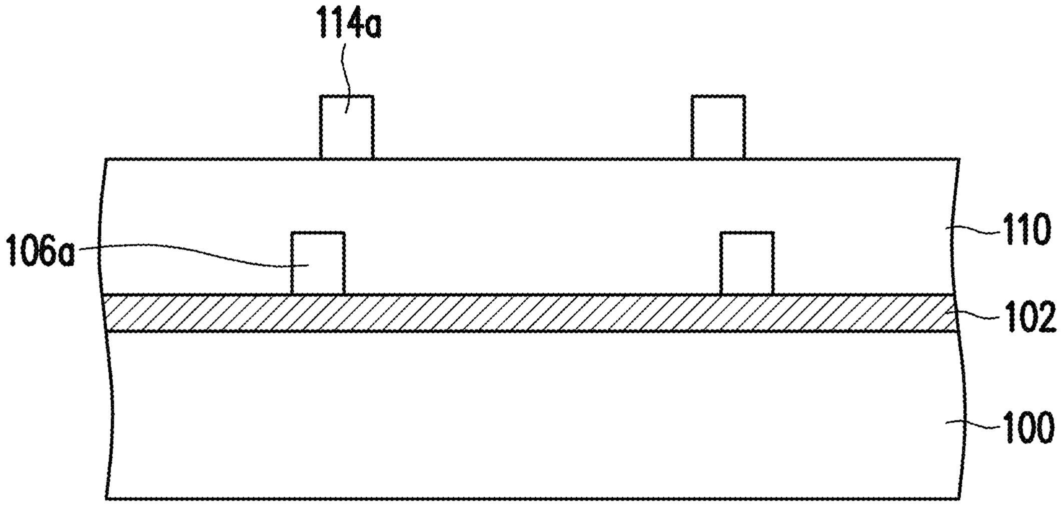
Figure 3D:
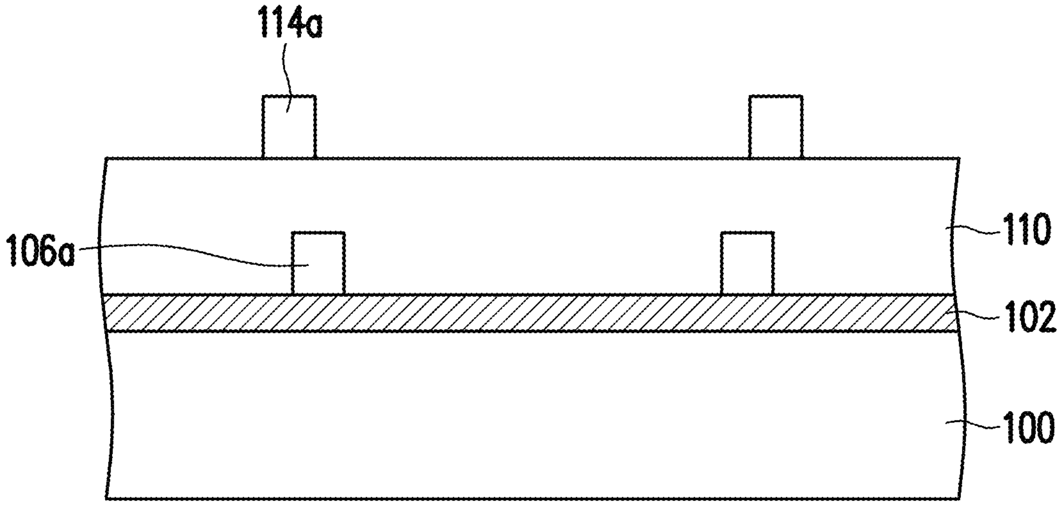

Referring to FIGS. 1D, 2D and 3D, the second bulk pattern layer 112 and the second strip pattern layers 212 are removed. A second mask ring 114*a* (the second mask material layer 114) is remained on the first dielectric layer 110 in the peripheral region 100*a*, and a plurality of second mask strips 214 (the second mask material layer 114) are remained on the first dielectric layer 110 in the device region 100*b*. In the present embodiment, a well-known self-aligned double patterning process may be used to form the second mask ring 114*a* and the second mask strips 214.

The position of the first bulk pattern layer 104 and the position of the second bulk pattern layer 112 are partially overlapped. The first bulk pattern layer 104 has a larger length in the X direction, and the second bulk pattern layer 112 has a larger length in the Y direction. As shown in FIGS. 1D, 2D and 3D, the first mask ring 106*a* and the second mask ring 114*a* are partially overlayed. The first mask ring 106*a* may have a larger length in the X direction, and the second mask ring 114*a* may have a larger length in the Y direction.

A patterning process is performed on the second mask ring 114*a*, the first dielectric layer 110 and the first mask ring 106*a* to form a third mask ring on the conductive layer 102 in the peripheral region 100*a* corresponding to the overlapping region of the first mask ring 106*a* and the second mask ring 114*a*.

Figure 1E:
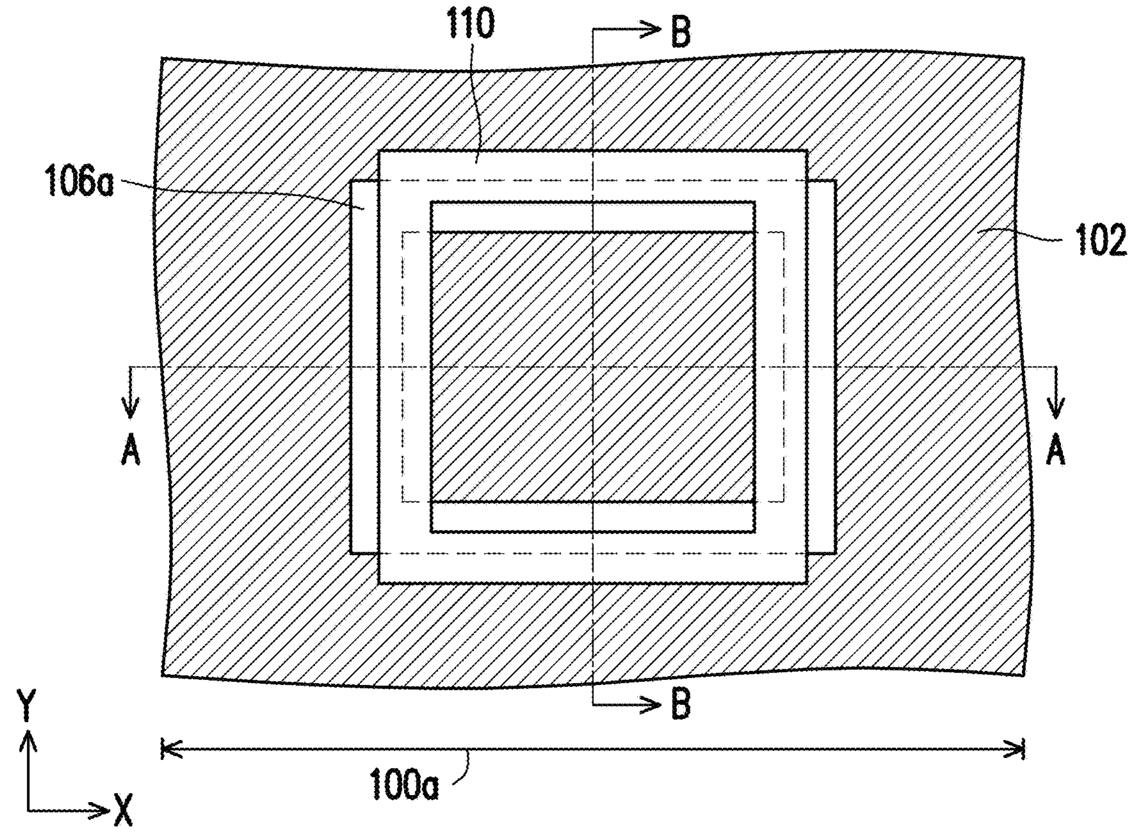
Figure 1E:
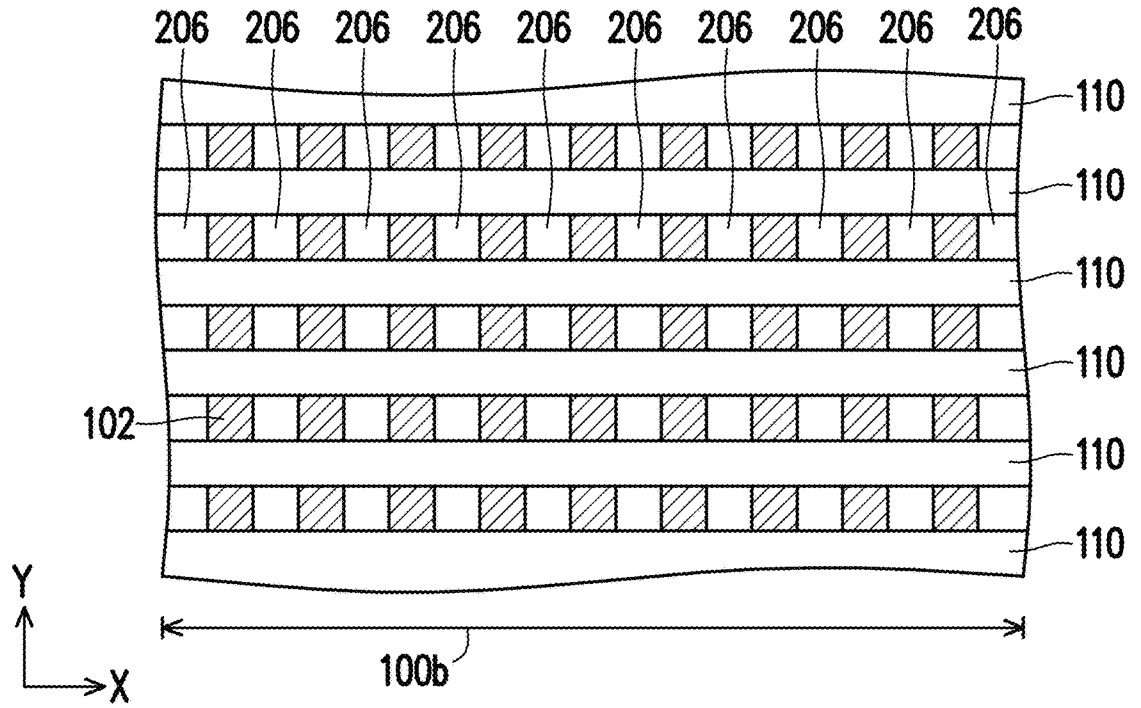
Figure 2E:
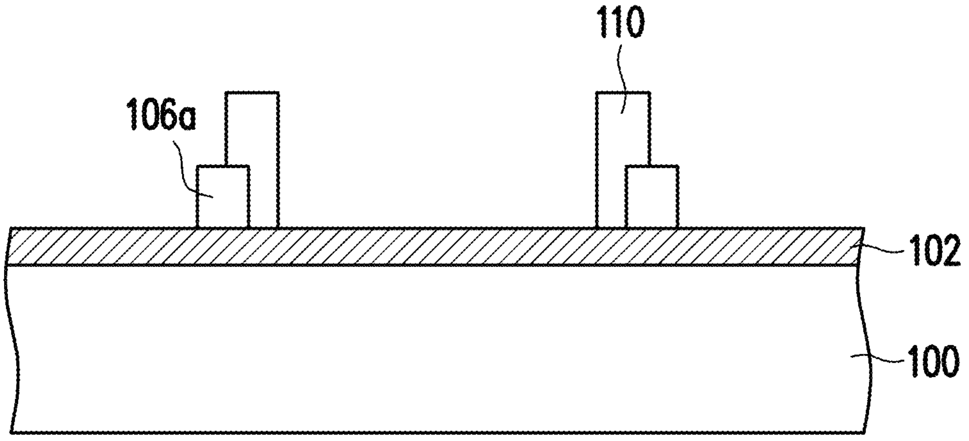
Figure 3E:
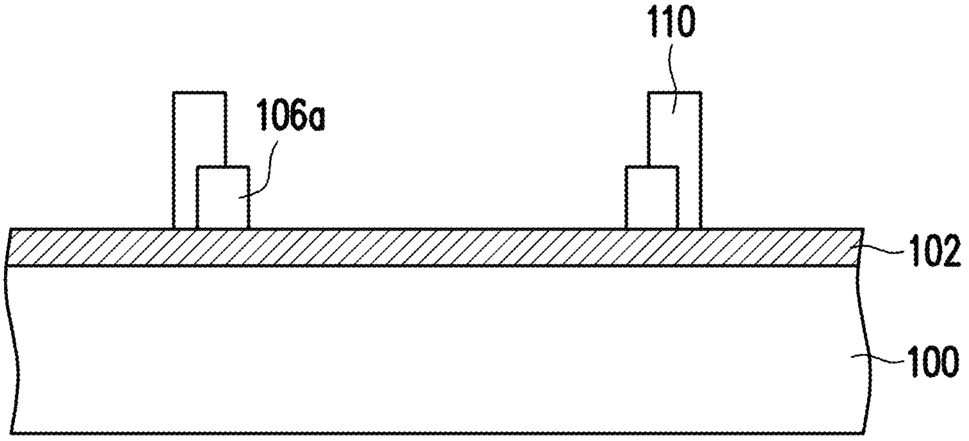

Referring to FIGS. 1E, 2E and 3E, using the second mask ring 114*a* and the second mask strips 214 as a mask, an anisotropic etching process is performed to remove the exposed first dielectric layer 110. In this way, a part of the first mask ring 106*a* and a part of the conductive layer 102 are exposed in the peripheral region 100*a*, and a part of the first mask strip 206 and a part of the conductive layer 102 are exposed in the device region 100*b*. Afterwards, the second mask ring 114*a* and the second mask strips 214 are removed. At this time, in the peripheral region 100*a*, the annular first dielectric layer 110 is formed at a position corresponding to the second mask ring 114*a*, and in the device region 100*b*, the strip-shaped first dielectric layers are formed at a position corresponding to the second mask strips 214.

Figure 1F:
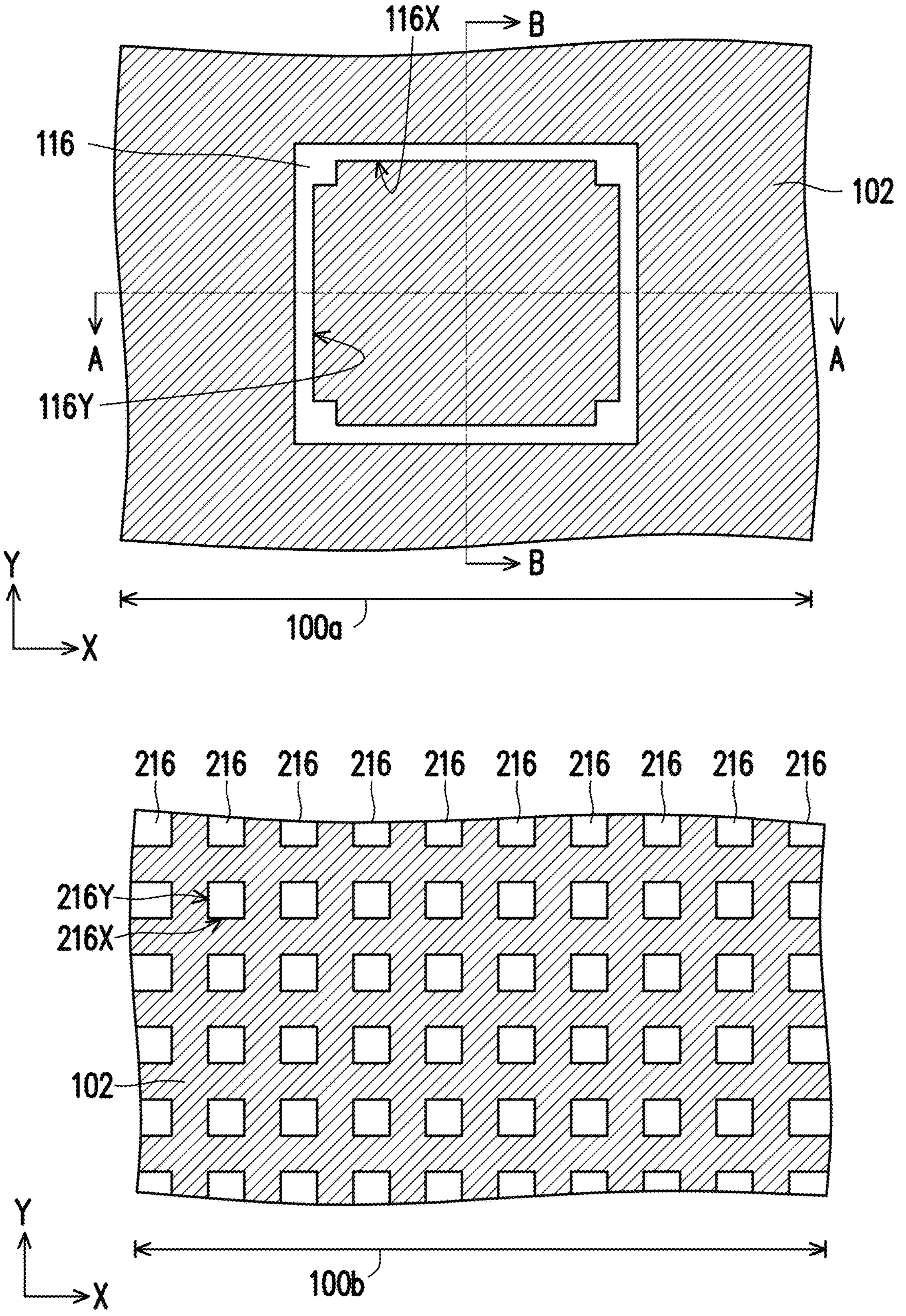
Figure 2F:
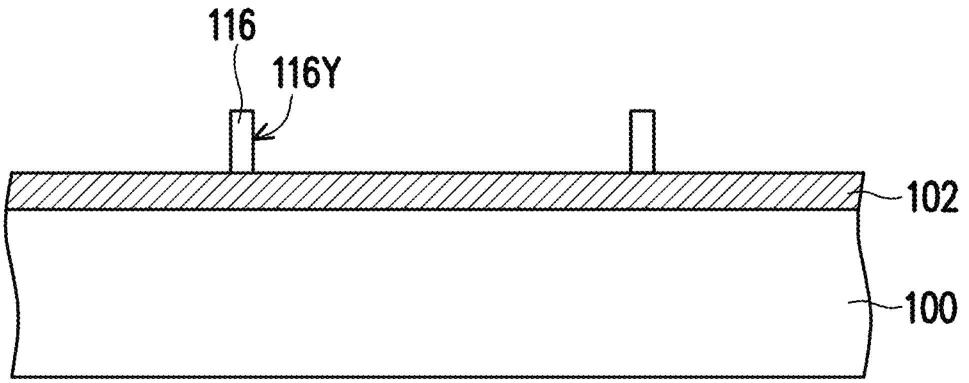
Figure 3F:
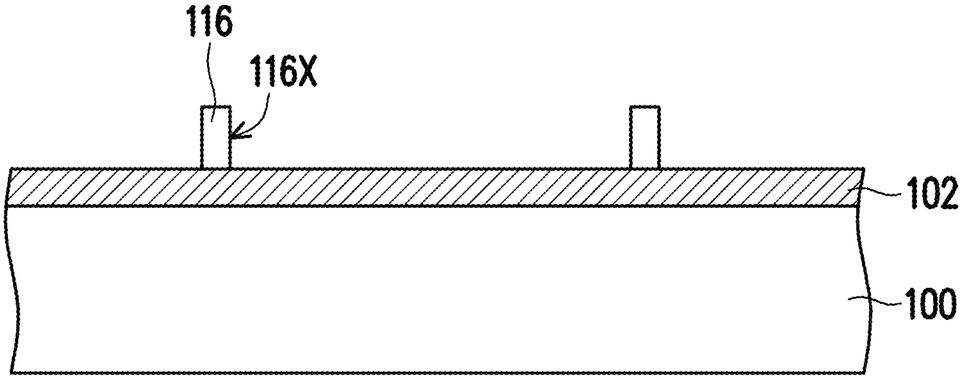

Referring to FIGS. 1F, 2F and 3F, using the annular first dielectric layer 110 in the peripheral region 100*a* and the strip-shaped first dielectric layer 110 in the device region 100*b* as a mask, an anisotropic etching process is performed to remove the exposed first mask ring. 106*a* and the exposed first mask strip 206. After that, the annular first dielectric layer 110 and the strip-shaped first dielectric layer 110 are removed. A third mask ring 116 composed of the remaining first mask ring 106*a* is formed in the peripheral region 100*a*, and an array of a plurality of mask bulks 216 composed of the remaining first mask strips 206 is formed in the device region 100*b*.

The third mask ring 116 is substantially a rectangular ring, and the third mask ring 116 has two inner sidewalls 116X extending in the X direction and two inner sidewalls 116Y extending in the Y direction. In addition, each mask bulk 216 has two sidewalls 216X extending in the X direction and two sidewalls 216Y extending in the Y direction.

The sidewalls of the first bulk pattern layer 104 defines the inner sidewalls of the first mask ring 106*a* extending in the Y direction, and the inner sidewalls of the first mask ring 106*a* extending in the Y direction define the inner sidewalls 116Y of the third mask ring 116. In addition, the sidewalls of the first strip pattern layers 204 extend in the Y direction define the sidewalls 216Y of the mask bulks 216 extending in the Y direction. Since the first bulk pattern layer 104 and the first strip pattern layers 204 are defined simultaneously through one photomask, the inner sidewalls 116Y of the third mask ring 116 may be defined Y-direction alignment line during the alignment measurement process corresponding to the sidewalls 216Y of the mask bulks 216.

The sidewalls of the second bulk pattern layer 112 define the inner sidewalls of the second mask ring 114*a* extending in the X direction, and the inner sidewalls of the second mask ring 114*a* extending in the X direction define the inner sidewalls 116X of the third mask ring 116. In addition, the sidewalls of the second strip pattern layers 212 extending in the X direction define the sidewalls 216Y of the mask bulks 216 extending in the X direction. Since the second bulk pattern layer 112 and the second strip pattern layers 212 are defined simultaneously through one photomask, the inner sidewalls 116X of the third mask ring 116 may be defined X-direction alignment line during the alignment measurement process corresponding to the sidewalls 216X of the mask bulks 216.

Figure 1G:
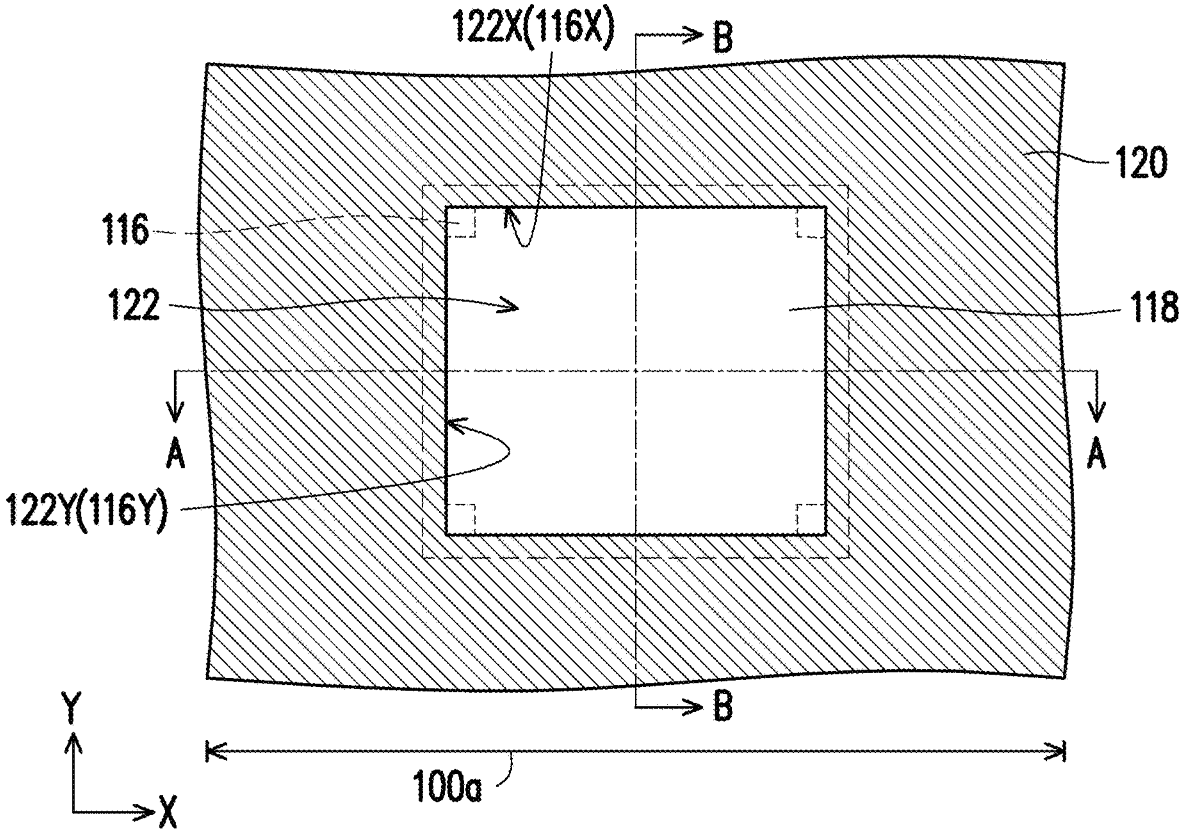
Figure 1G:
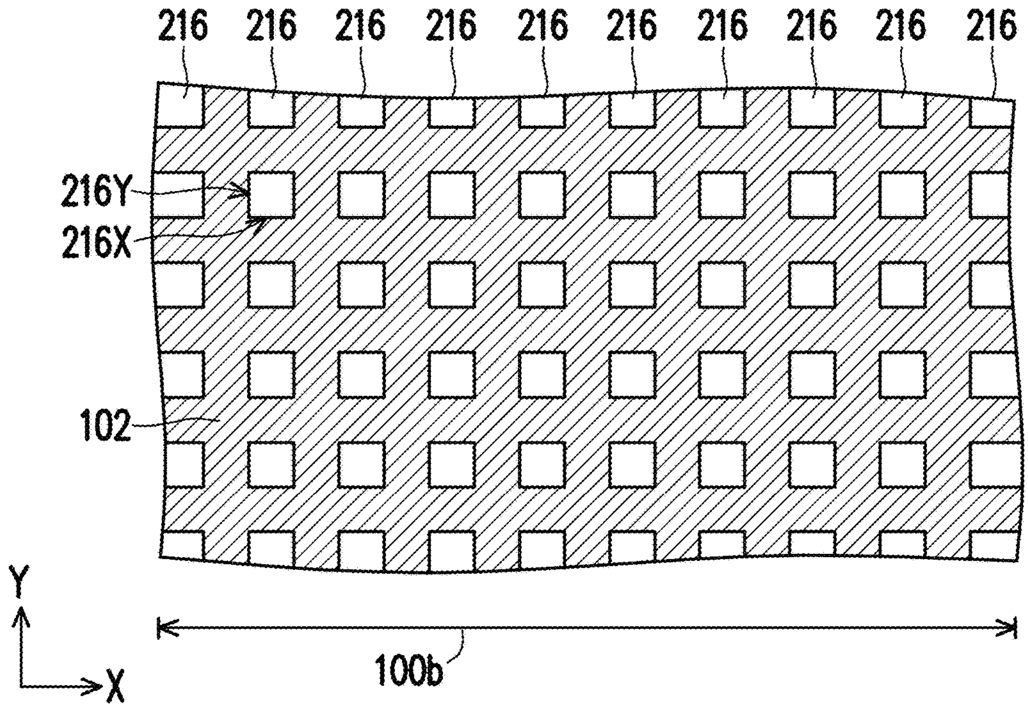
Figure 2G:
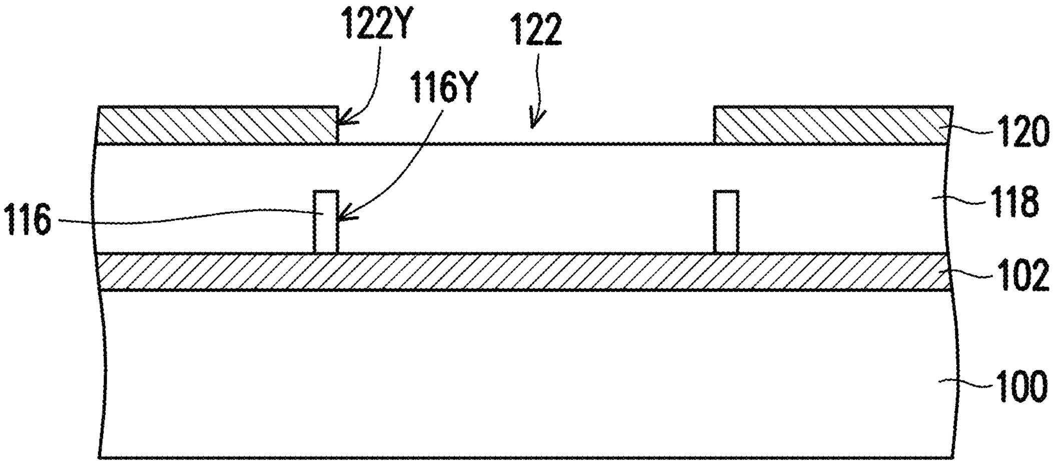
Figure 3G:
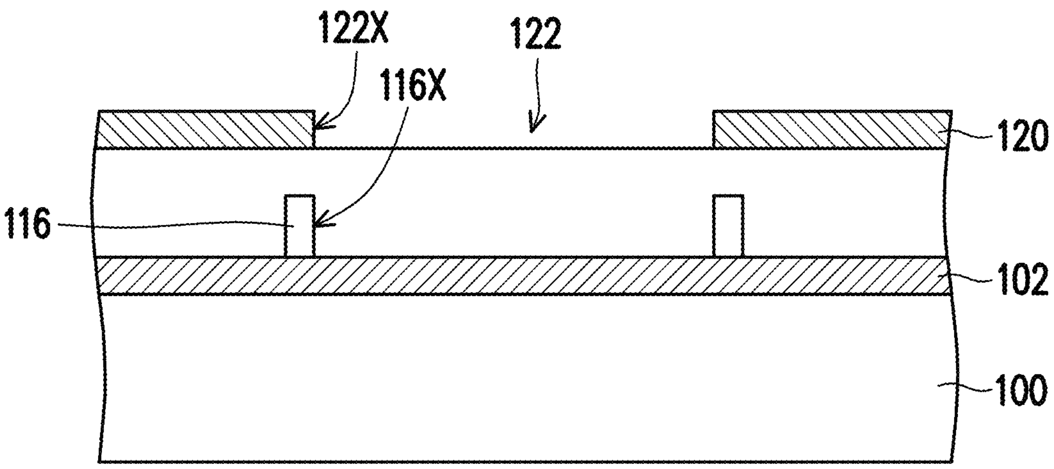

Referring to FIGS. 1G, 2G and 3G, a second dielectric layer 118 is formed on the substrate 100. The second dielectric layer 118 covers the conductive layer 102 and the third mask ring 116 in the peripheral region 100*a*, and exposes the device region 100*b*. A mask pattern layer 120 is formed on the second dielectric layer 118. In the present embodiment, the mask pattern layer 120 may be a metal layer, such as a tungsten layer, but the present invention is not limited thereto. The mask pattern layer 120 has an opening 122, and the inner sidewall of the opening 122 is aligned with the inner sidewall of the third mask ring 116. The inner sidewalls 122X of the opening 122 extending in the X direction are aligned with the inner sidewalls 116X of the third mask ring 116, and the inner sidewalls 122Y of the opening 122 extending in the Y direction are aligned with the inner sidewalls 116Y of the third mask ring 116. The mask pattern layer 120 may be formed simultaneously with the circuit layer in a region other than the device region 100*b*, but the present invention is not limited thereto.

Figure 1H:
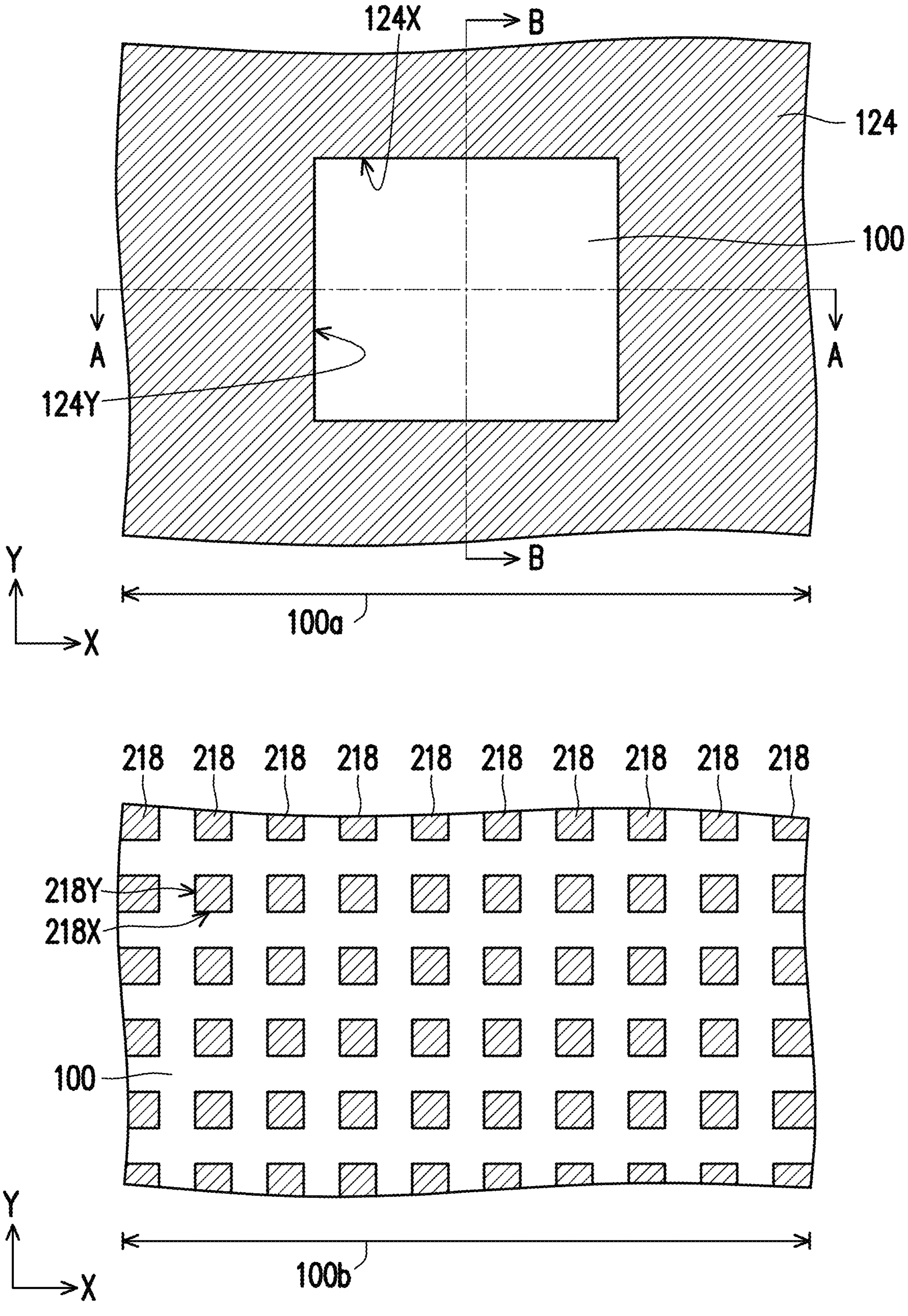
Figure 2H:
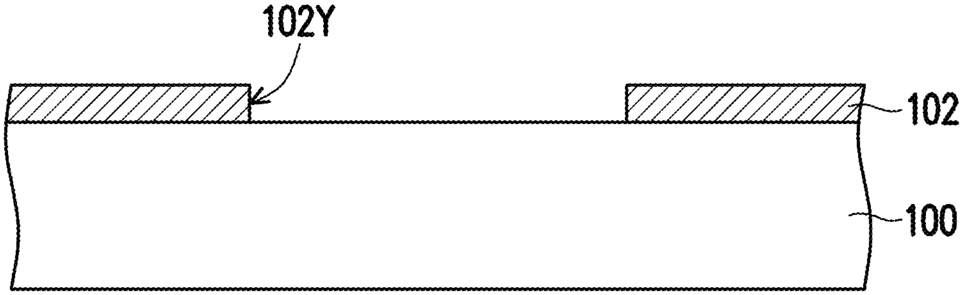
Figure 3H:
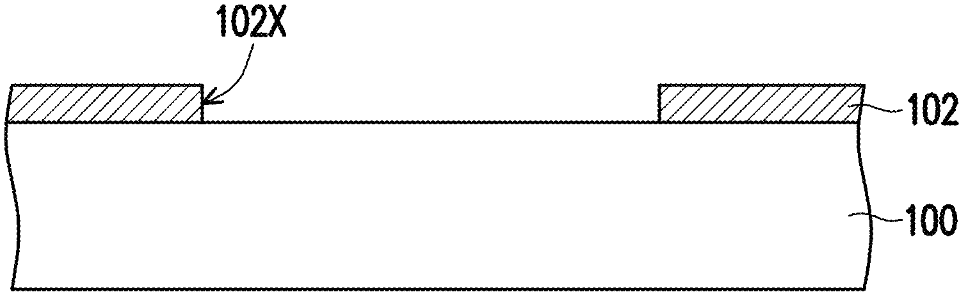

Referring to FIGS. 1H, 2H and 3H, using the mask pattern layer 120 as the mask, an anisotropic etching process is performed to remove the second dielectric layer 118 exposed by the opening 122. Next, the mask pattern layer 120 is removed. Using the remaining second dielectric layer 118 and the mask bulks 216 as the mask, an anisotropic etching process is performed to remove the exposed conductive layer 102. An overlay mark 124 defined by the mask pattern layer 120 is formed on the substrate 100 in the peripheral region 100*a*, and pads 218 defined by the mask bulks 216 are formed on the substrate 100 in the device region 100*b*. After that, the second dielectric layer 118, the third mask ring 116 and the mask bulks 216 are removed.

Since the inner sidewall of the opening 122 of the mask pattern layer 120 is aligned with the inner sidewall of the third mask ring 116, the inner sidewalls 124X and inner sidewalls 124Y of the overlay mark 124 defined by the mask pattern layer 120 may respectively correspond to the inner sidewalls 218X and the inner sidewalls 218Y of the pads 218 defined by the mask bulks 216. Therefore, the inner sidewalls 124X and the inner sidewalls 124Y of the overlay mark 124 may be used as the X-direction alignment line and the Y-direction alignment line respectively during the alignment measurement process.

In the prior art, when a pad array is formed in the device region, an overlay mark with the same pattern as the pad array is formed in the peripheral region. This type of overlay mark cannot have a clear optical image when measuring alignment with the optical instrument, and the contrast of the optical image is low. In the present embodiment, the overlay mark 124 has a larger size than the pad 218 and is bulk, so a clear optical image may be obtained when measuring alignment with the optical instrument, and the contrast of the optical image may be effectively improved. In this way, the problem of alignment measurement errors may be effectively reduced or even avoided.

It will be apparent to those skilled in the art that various modifications and variations may be made to the disclosed embodiments without departing from the scope or spirit of the invention. In view of the foregoing, it is intended that the invention covers modifications and variations provided that they fall within the scope of the following claims and their equivalents.

What is claimed is:

1. A manufacturing method of an overlay mark, comprising:
- forming a target layer on a substrate;
- forming a first mask ring on the target layer;
- forming a first dielectric layer on the first mask ring;
- forming a second mask ring on the first dielectric layer, wherein a length of the first mask ring in a first direction is greater than a length of the second mask ring in the first direction, a length of the first mask ring in a second direction is less than a length of the second mask ring in the second direction, and the first direction is interlaced with the second direction;
- performing a patterning process on the second mask ring, the first dielectric layer and the first mask ring to form a third mask ring on the target layer corresponding to an overlapping region of the first mask ring and the second mask ring;
- forming a second dielectric layer on the target layer and the third mask ring;
- forming a mask pattern layer on the second dielectric layer, wherein the mask pattern layer has an opening, and the inner sidewall of the opening is aligned with the inner sidewall of the third mask ring;
- removing a part of the second dielectric layer and a part of the target layer using the mask pattern layer as a mask; and
- removing the mask pattern layer, the second dielectric layer and the third mask ring.

2. The manufacturing method of claim 1, wherein a forming method of the first mask ring comprises:
- forming a first bulk pattern layer on the target layer;
- form a first mask material layer on a sidewall of the first bulk pattern layer; and
- removing the first bulk pattern layer.

3. The manufacturing method of claim 2, wherein a method for forming the first mask material layer comprises:
- conformally forming a layer of mask material on the substrate; and
- performing an anisotropic etching process to remove a part of the mask material.

4. The manufacturing method of claim 2, wherein a forming method of the second mask ring comprises:
- forming a second bulk pattern layer on the first dielectric layer, wherein the second bulk pattern layer is located above the first bulk pattern layer, a length of the second bulk pattern layer in the first direction is less than a length of the first bulk pattern layer in the first direction, and a length of the second bulk pattern layer in the second direction is greater than a length of the first bulk pattern layer in the second direction;
- forming a second mask material layer on a sidewall of the second bulk pattern layer; and
- removing the second bulk pattern layer.

5. The manufacturing method of claim 4, wherein a method for forming the second mask material layer comprises:
conformally forming a layer of mask material on the substrate; and
performing an anisotropic etching process to remove a part of the mask material.

6. The manufacturing method of claim 4, wherein a forming method of the third mask ring comprises:
removing a part of the first dielectric layer using the second mask ring as a mask;
removing the second mask ring;
removing a part of the first mask ring using the remaining first dielectric layer as a mask; and
removing the remaining first dielectric layer.

7. The manufacturing method of claim 6, wherein a forming method for removing the part of the first dielectric layer comprises performing an anisotropic etching process.

8. The manufacturing method of claim 6, wherein a forming method for removing the part of the first mask ring comprises performing an anisotropic etching process.

9. The manufacturing method of claim 6, wherein the substrate has a device region and a peripheral region, and the target layer is located on the substrate in the peripheral region.

10. The manufacturing method of claim 9, wherein a first device material layer is formed on the substrate in the device region when forming the target layer, and the target layer corresponds to the device material layer.

11. The manufacturing method of claim 10, wherein a material of the target layer is the same as a material of the device material layer.

12. The manufacturing method of claim 10, wherein the device material layer is conductive layer.

13. The manufacturing method of claim 12, wherein the device material layer comprises a pad material layer.

14. The manufacturing method of claim 10, wherein:
when forming the first bulk pattern layer, a plurality of first strip pattern layers extending along the second direction are formed above the first device material layer, and the first bulk pattern layer and the plurality of first strip pattern layers are defined simultaneously through one photomask,
the first mask material layer is further formed on sidewalls of the plurality of first strip pattern layers, and
when removing the first bulk pattern layer, the plurality of first strip pattern layers are removed.

15. The manufacturing method of claim 14, wherein:
when forming the second bulk pattern layer, a plurality of second strip pattern layers extending along the first direction are formed above the plurality of first strip pattern layers, and the second bulk pattern layer and the plurality of second strip pattern layers are defined simultaneously through one photomask,
the second mask material layer is further formed on sidewalls of the plurality of second strip pattern layers, and
when removing the second bulk pattern layer, the plurality of second strip pattern layers are removed.

16. The manufacturing method of claim 9, wherein the mask pattern layer and the second dielectric layer expose the device region.

17. The manufacturing method of claim 1, wherein third mask ring is substantially a rectangular ring.

18. The manufacturing method of claim 1, wherein a material of the mask pattern layer comprises a metal layer.

19. The manufacturing method of claim 1, wherein a forming method for removing the part of the second dielectric layer and the part of the target layer comprises:
removing the second dielectric layer exposed by the opening using the mask pattern layer as a mask;
removing the mask pattern layer; and
removing the exposed target layer using the remaining second dielectric layer as a mask.

* * * * *